United States Patent [19]

Huelsman et al.

[11] 4,216,465
[45] Aug. 5, 1980

[54] PROGRAMMABLE ANALOG TO DIGITAL CONVERTER

[75] Inventors: Kenneth A. Huelsman, Carlsbad; Joe E. Deavenport, San Diego, both of Calif.

[73] Assignee: Hughes Aircraft Company, Culver City, Calif.

[21] Appl. No.: 884,330

[22] Filed: Mar. 7, 1978

[51] Int. Cl.² .................................... H03K 13/02
[52] U.S. Cl. .................. 340/347 AD; 340/347 M; 364/608
[58] Field of Search ............... 340/347 M, 347 AD; 179/15 AV; 364/607, 608

[56] References Cited

U.S. PATENT DOCUMENTS

| | | | |
|---|---|---|---|
| 3,597,761 | 8/1971 | Fraschilla et al. | 340/347 AD |
| 3,646,548 | 2/1972 | Van Doren | 340/347 AD |
| 4,099,173 | 7/1978 | Zeskind et al. | 340/347 M |
| 4,143,366 | 3/1979 | Lewis | 340/347 AD |

Primary Examiner—Thomas J. Sloyan

Attorney, Agent, or Firm—Walter J. Adam; W. H. MacAllister

[57] ABSTRACT

A programmable analog to digital (A/D) converter useful for example, in ultrasonic medical diagnosis systems, for providing transfer functions that in some arrangements may be manually selected and in other arrangements may be automatically selected as a function of time. A ladder network providing the comparator reference voltages in the converter is driven at a plurality of control nodes or points by programmed control voltage sets received from, for example, a resistive network or from a digital source through a digital to analog converter. In the arrangement in which the transfer function changes as a function of time, different transfer curves are selected having a predetermined relationship to the amplitude levels of the input signal which, for example, may be an ultrasonic return signal in a medical diagnosis system. The analog to digital converter of the invention has the advantage in a system providing imaging data, that gray levels of interest may be emphasized without increasing the finite number of overall system gray levels.

9 Claims, 9 Drawing Figures

PROGRAMMABLE ANALOG TO DIGITAL CONVERTER

BACKGROUND OF THE INVENTION

This invention relates to analog to digital converters and particularly to a programmable analog to digital converter that provides manually selected transfer functions or time varying transfer functions between the analog input signal and the digital output signal.

In some systems such as ultrasonic or radiography systems for medical diagnosis it would be desirable to be able to emphasize certain gray levels without requiring an excessive number of finite gray levels to be provided in the overall system design. For example, in a converter system which has 16 gray levels and a 4 bit digital output, the sensitivity could be increased in certain input voltage amplitude level regions so that the system in the area of interest would be equivalent to a system having a much greater number of gray levels. In an ultrasonic system for example, the encoding of the full range of the image may be normally sufficient with 16 digital levels. However, a band of information in the lower version of amplitudes may need encoding to the equivalent of 32 levels full scale in order to separate specific anatomical differences in the echo returns. Utilizing the system of the invention, 8 main levels might be distributed between levels 2 and 4 of the more gross 16 level system giving the desired resolution but using only 16 levels overall. This arrangement would result in a saving of approximately 20% in any memory which followed the A/D converter as well as a saving of approximately 50% of the number of components in the A/D converter itself. Also, in systems such as ultrasound or radiography systems, the echo signal or input video signal is applied and reflected from different body structures such as the liver and kidneys which have characteristics such that the reflected signals from each has different amplitude characteristics. In order to emphasize and clearly image all of the body structures it would be desirable if matching analog to digital transfer functions were provided for each body structure. Thus, an analog to digital converter that is programmable so that different transfer functions could be selected or could be automatically provided for different body structures would be highly useful in a great number of systems such as for example, ultrasonic or radiography.

U.S. Pat. Nos. 3,544,779 and 3,646,548 teach arrangements for providing or controlling the reference voltages applied to the comparators in an analog to digital converter. The U.S. Pat. No. 3,544,779 teaches a self adjusting radix converter and the U.S. Pat. No. 3,646,548 teaches the use of nonlinear comparators having a fixed nonlinear curve, but neither patent teaches the use of a programmed input source to provide desired transfer functions. A programmable analog to digital converter controlling the pulse rate and sensing the number of output pulses is described in U.S. Pat. No. 3,349,390 but this converter only converts the voltage output of a nonlinear transducer into a pulse group proportional in number to the input signal by utilizing a programmed pulse generator. The digital system of this U.S. Pat. No. 3,349,390 does not teach programming of a ladder network type analog to digital converter.

SUMMARY OF THE INVENTION

A programmable analog to digital converter is provided in which transfer functions may be programmed varying from linear to a desired number of nonlinear functions and in which any desired function may be selected. In one arrangement in accordance with the invention, the transfer function is time variable to provide proper functions for emphasizing body areas of interest being diagnosed by an ultrasonic sensor, for example. The input analog voltage is amplified and applied to one side of each of a plurality of comparators, the other or reference voltage input to the comparator being received from a ladder network having a plurality of series coupled resistors with connecting points therebetween. The output signals from the comparators are applied to a priority encoder which provides the binary output signals. The ladder network is driven at a plurality of control nodes or points which are selected connecting points so as to provide the capability of warping or nonlinearizing the transfer function along selected inflection points. The control or drive voltages for these inflection points may be derived from sources such as resistive header networks, potentiometers, digital to analog converters receiving their input signals from a digital control source or other analog control voltage sources. For the time variable function, a digital source may be controlled by a counter to change after predetermined time intervals from one programmed transfer function or curve to another. The analog to digital converter of the invention allows the finite number of digital levels of a converter system to be assigned or apportioned so that input signal levels of interest may be emphasized with more detail, thus greatly decreasing the overall system digital level requirements.

It is therefore an object of this invention to provide a programmable analog to digital converter that functions with a plurality of stored transfer functions.

It is another object of this invention to provide an analog to digital converter that minimizes the overall system gray level requirements so as to utilize a minimum number of components in the converter and to require a relatively small follow on memory.

It is a further object of this invention to provide an analog to digital converter that allows a finite number of digital gray levels to be assigned among the levels of the input signal so that gray levels of interest may be emphasized with increased detail.

It is a still further object of this invention to provide an analog to digital converter useful for converting data received from a human body being diagnosed such as with ultrasonics, and which develops a signal that provides a high resolution display.

It is a still further object of this invention to provide an analog to digital converter that develops output digital values in accordance with a time varying transfer function useful in providing high resolution display data in an ultrasonic medical diagnosis system.

BRIEF DESCRIPTION OF THE DRAWINGS

These and other objects, features and advantages of the invention as well as the invention itself will become apparent to those skilled in the art in the light of the following detailed description taken in consideration with the accompanying drawings wherein like reference numerals indicate like or corresponding parts throughout the several views wherein.

DESCRIPTION OF THE PREFERRED EMBODIMENTS

Figure 1:
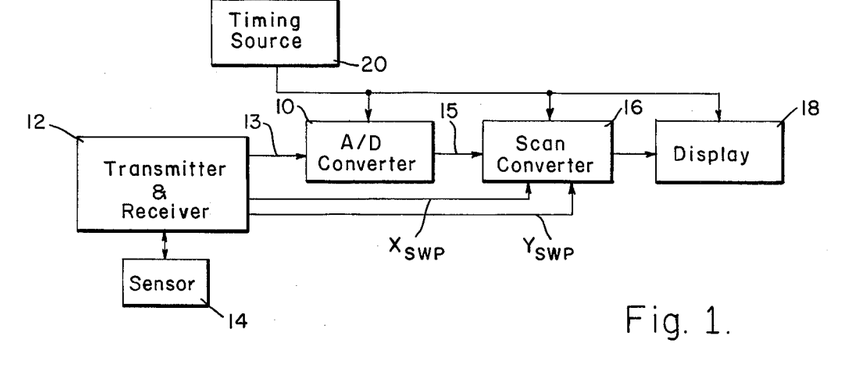
FIG. 1 is a schematic block diagram illustrating an ultrasonic medical diagnosis system in which the analog to digital converter in accordance with the invention may be utilized.

Referring first to FIG. 1, an A/D (analog to digital) converter 10 is shown in a system illustrated as an ultrasonic system of the pulse-echo type such as is utilized for medical diagnosis. Ultrasonic systems have been found to be an excellent medical diagnostic tool and serve to provide displays of internal body configurations. Ultrasonic medical diagnosis systems are well known in the art, such as for example, as disclosed in U.S. Pat. Nos. 3,864,660 and 3,864,661. It is to be understood that although the converter of the invention is explained principally relative to its use in an ultrasonic system, the principles of the converter of the invention are equally applicable to use in any other type of system such as a radiography system or a process control system. The illustrated ultrasonic system includes a transmitter and receiver 12 transmitting ultrasonic energy to a sensor 14 and receiving reflected energy from the sensor 14 to provide a video signal $V_{IN}$ on a lead 13, which signal is applied to an A/D converter 10. A digital output of the A/D converter 10 then may be applied through a composite lead 15 to suitable processing circuits such as a scan converter 16 which in turn supplies digital video signals to a display system 18 which may be either an analog or a digital television display on a storage tube, for example. A timing source 20 synchronizes and controls the timing of the entire system including applying a SWP ON (sweep on) signal to the transmitter and receiver 12. The transmitter and receiver 12 applies $X_{SWP}$ and $Y_{SWP}$ sweep timing signals to the scan converter 16. The display system 18 as is well known in the ultrasonic system art, provides a display, when the sensor is moved across a person's body such as in a sector scan, that has one dimension corresponding to the movement of the sensor across the body and has the other dimension corresponding to depth in the direction of transmission into the person's body.

Figure 2:
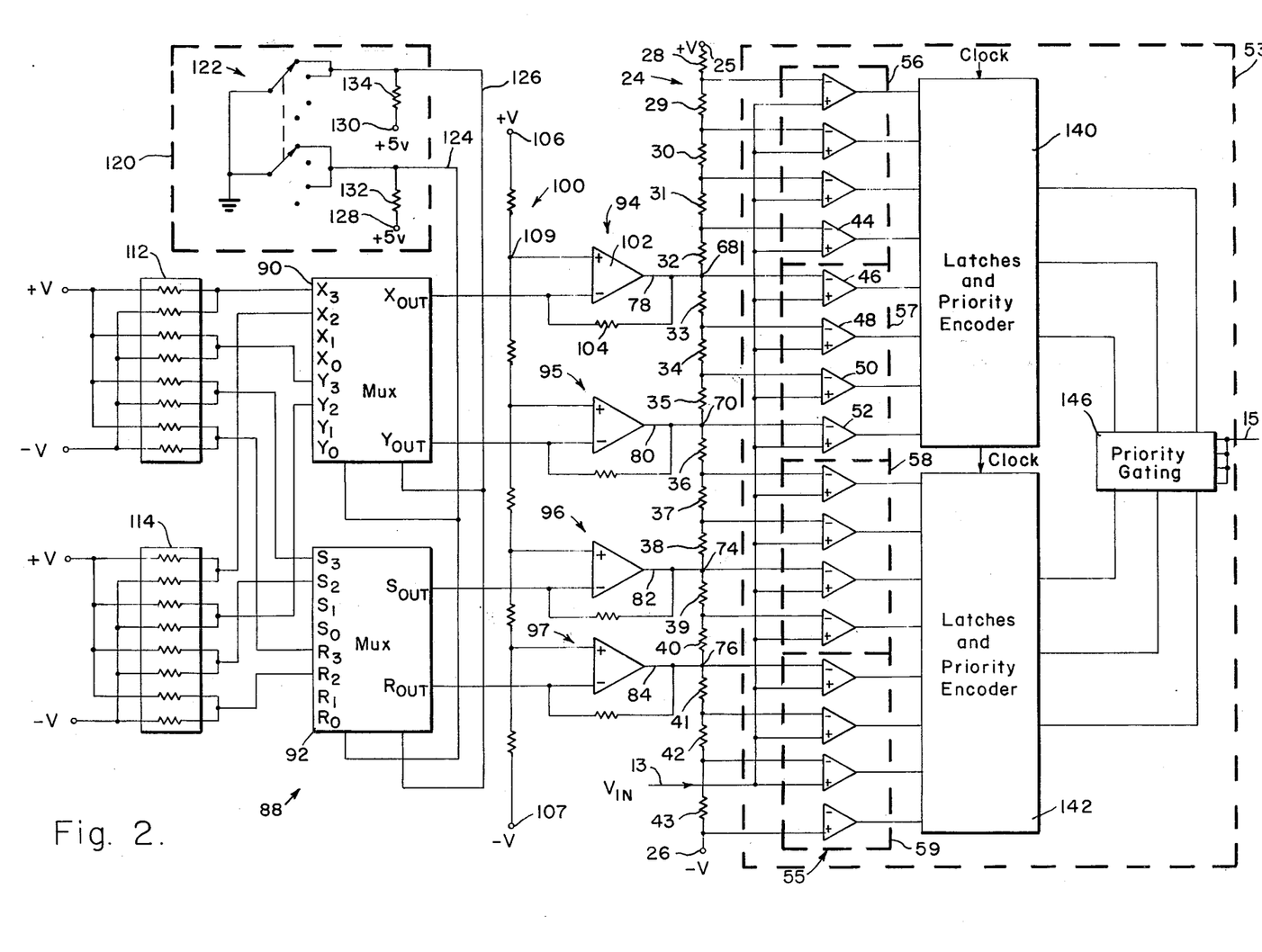
FIG. 2 is a schematic circuit and block diagram showing an analog programmed arrangement of the programmable analog to digital converter in accordance with the invention.

Referring now to FIG. 2 showing one arrangement of the programmable analog to digital converter in accordance with the invention, a ladder network 24 is coupled between a positive reference voltage terminal 25 providing a voltage $+V$ and a negative reference voltage terminal 26 which for example, may provide a voltage $-V$. The ladder network 24 which is a weighted serial chain of resistors includes resistors 28 to 43 with connecting or tap points or nodes therebetween, for providing comparison voltages to a comparator means 55 which includes 16 comparators such as 44, 46, 48, 50, 52 and 54 of comparator units 56, 57, 58 and 59. Each comparator unit may have four comparators therein and may be a standard unit such as IC (integrated circuit) number MC3430. Also, each of the comparators receives at its other input terminal a video input voltage $V_{IN}$ on the lead 13 representing the video echo signal from a sensor. In the illustrated arrangement, the ladder network 24 has four programmable control points or nodes 68, 70, 74 and 76, which are selected ones of the resistor connecting points and are each coupled to a respective input lead 78, 80, 82 and 84. Each programmable point or node of the ladder 24 is also coupled as a reference signal input to the corresponding comparator and thus provides a programmed reference to the comparator, for comparison with the input signal $V_{IN}$. The comparators means 55 is included in a comparator and priority encoding system 53.

The input signals to the control nodes or points are provided by a programmed source of voltage 88 illustrated for programming curves or transfer functions through multiplexers 90 and 92 each of which respectively has outputs $X_{OUT}$ and $Y_{OUT}$ and outputs $S_{OUT}$ and $R_{OUT}$ which are respectively applied to amplifier units 94 to 97. The signals $X_{OUT}$, $Y_{OUT}$, $S_{OUT}$ and $R_{OUT}$ are the current sets or signal sets that are amplified and applied to respective control points 68, 70, 74 and 76, with each current set providing a different converter transfer function. The amplifier units 94 to 97 each include a differential amplifier such as 102 surrounded by a feedback resistor 104 with the negative input terminal and the feedback resistor 104 coupled to the multiplexer such as 90 and the positive input coupled to a tap point or node such as 109 of a weighted resistive divider chain 100 which may have resistors of values the same as the ladder network 24 between a $+V$ potential terminal 106 and a $-V$ potential terminal 107, for example. The voltage on each node of the divider chain 100 such as the node 109 is selected to be the same as the voltage at the control points such as 68 of the ladder network 24. Thus, the amplifiers such as 94 are referenced to the divider chain 100 to provide a low impedance into the ladder network 24.

Resistor networks or headers 112 and 114 coupled between a suitable positive terminal $+V$ and a negative terminal $-V$ function to provide the programmed analog input current sets for the illustrated first and second curves or transfer functions. The resistor network 112 is coupled to terminals $X_3$, $Y_3$, $S_3$, $R_3$ of the multiplexers 90 and 92, respectively representing the programmed currents for the program or control points 68, 70, 74 and 76, and the resistive network 114 is coupled to the points $X_2$, $Y_2$, $S_2$, $R_2$ of the multiplexers 90 and 92 for providing a set of programmed analog currents to the same four control points of the ladder network 24. It is to be noted that any number of transfer functions may be programmed in the multiplexers 90 and 92 with suitable resistive networks. Further, it is to be understood that the scope of the invention includes other suitable arrangements for being programmed such as an analog charge storage device applying signals to the multiplexers, a digital memory with digital to analog converters amd individual storage units for directing the voltages to the proper control points or a plurality of simultaneously addressed digital memories with analog conversion and sampling circuits.

In the illustrative arrangement, multiplexing units 90 and 92 are controlled by a transfer function selection source 120, illustrated as a four-position switch 122. The selection source 120 selectively provide four binary numbers through leads 124 and 126 to the multiplexers 90 and 92. The switch 122 is illustrated with first and second arms each movable between four contact points to provide binary voltages to the output leads 124 and 126, which voltages may either be at ground representing a binary zero or at +5 volts representing of a binary one. The binary one voltages are provided by voltage sources 128 and 130 which are coupled through respective resistors 132 and 134 to the leads 124 and 126. Thus, binary values 00, 01, 10 and 11 are applied to leads 124 and 126 or in the illustrated arrangement with only two stored transfer functions, only the first two binary values are applied to the leads 124 and 126. The selection unit 120 allows any of a plurality of stored transfer functions to be selected as a reference for the analog to digital conversion. It is to be understood that the selection unit 120 is not to be to be limited to the illustrated switch but includes any suitable sort of sequencing unit that will perform the selection function in response to either manual selection or automatic selection. The comparators apply their output signals to latching and priority encoder units 140 and 142 which in turn apply their output signals to a priority gating unit 146, all included in the comparator and priority encoding system 53.

The comparators such as 44 and 46 compare the voltages of increasing significance from bottom to top with the input signal voltage so that the comparator output goes high when the input signal applied to a comparator is at a higher level than the reference value. For example, the output signal from the comparator 52 goes high when the input signal $V_{IN}$ is at a higher level than the voltage at the control point 70. In this condition, all of the comparators of the units 58 and 59 have high level output voltages and the comparator 50 and all thereabove have low level output voltages. The control voltages for a transfer function may be either positive or negative. It is to be noted that for certain widely varying transfer functions as well as in systems in accordance with this invention with the ladder network 24 having a nonlinear ladder function for allowing the use of low levels of control voltages for the programmed functions, different control voltages for a transfer function may be either positive or negative.

In some arrangements of the invention, the ladder network 24 and the resistive divider 100 may be nonlinear rather than linear as to their ladder voltage at the various nodes versus the significance or comparison levels of the nodes. In the illustrated amplifying arrangement with a nonlinear ladder network 24, the resistive divider 100 has a nonlinear characteristic similar to that of the network 24.

Figure 3:
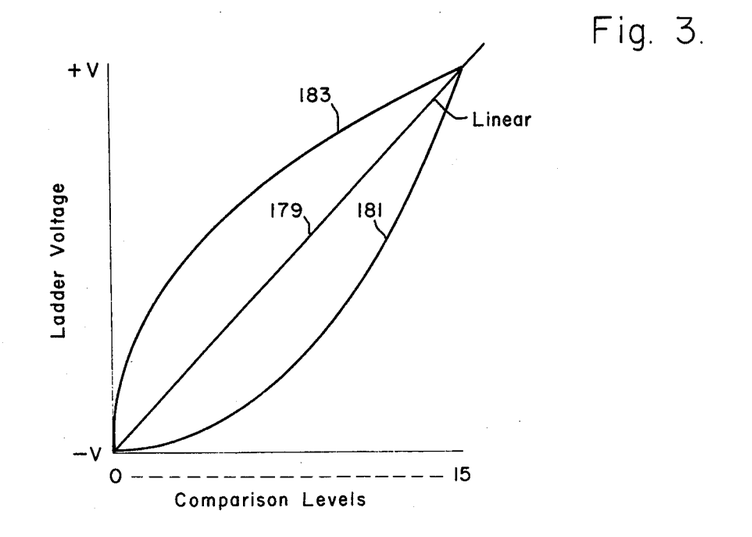
FIG. 3 is a graph of functions of ladder voltage at sequential voltage nodes versus output comparison levels for explaining variation of the basic ladder network in the converter systems in accordance with the invention.

Referring now also to FIG. 3, a linear ladder network 24 would provide a ladder voltage at the sequential nodes versus output comparison level function as shown by a curve 179. Some nonlinear converter transfer functions may require relatively large voltages to be applied to the control points of the ladder network. By warping or nonlinearizing the ladder transfer function into the nonlinear range of the selectable converter transfer functions, relatively small voltages are adequate at the control nodes or points, thus increasing the system stability and decreasing the system drift. If a basic ladder curve 181 is utilized and the transfer function is in a range above and below the curve 181, the required positive and negative control voltages are relatively small for selected transfer functions. The curve 181 provides a decreasing emphasis, response or resolution to the input signals as a function of increasing amplitude of the ladder voltage and would be advantageous when the overall converter transfer functions have a decreasing emphasis, response or resolution to input signals increasing in amplitude. Similarly, a ladder transfer function 183 may be utilized which provides an increasing emphasis, response or resolution to the input signals as a function of the ladder voltage increasing in amplitude, and may be utilized when the converter transfer functions are in that range and have an increasing emphasis, response or resolution to input signals increasing in amplitude. The curves 183 may be logarithmic or antilogarithmic in some arrangements in accordance with the invention, the output digital value being a logarithmic function of the input voltage.

To decrease shift of the operative amplifiers, the feedback resistance of the operative amplifier must be small so as to have a low level of drift. For a large voltage change at the ladder network control point a large input current to the operative amplifier is required which would make necessary to use of small header resistors. The use of small resistors in the resistive headers would cause the unknown resistance in the multiplexers to have detrimental effects such as requiring excessive calibration because of the multiplexer resistive values varying with time and temperature. The result would be variations in the programmed voltages applied to the control points. Thus, to eliminate drift of the operative amplifier, a nonlinear ladder network reference is utilized thus allowing the operative amplifier to only require a small input current change. The small programmed changes in the input current to the operative amplifier can be generated with large header resistors, thus negating the detrimental effects of the resistive variations in the multiplexers.

Figure 4:
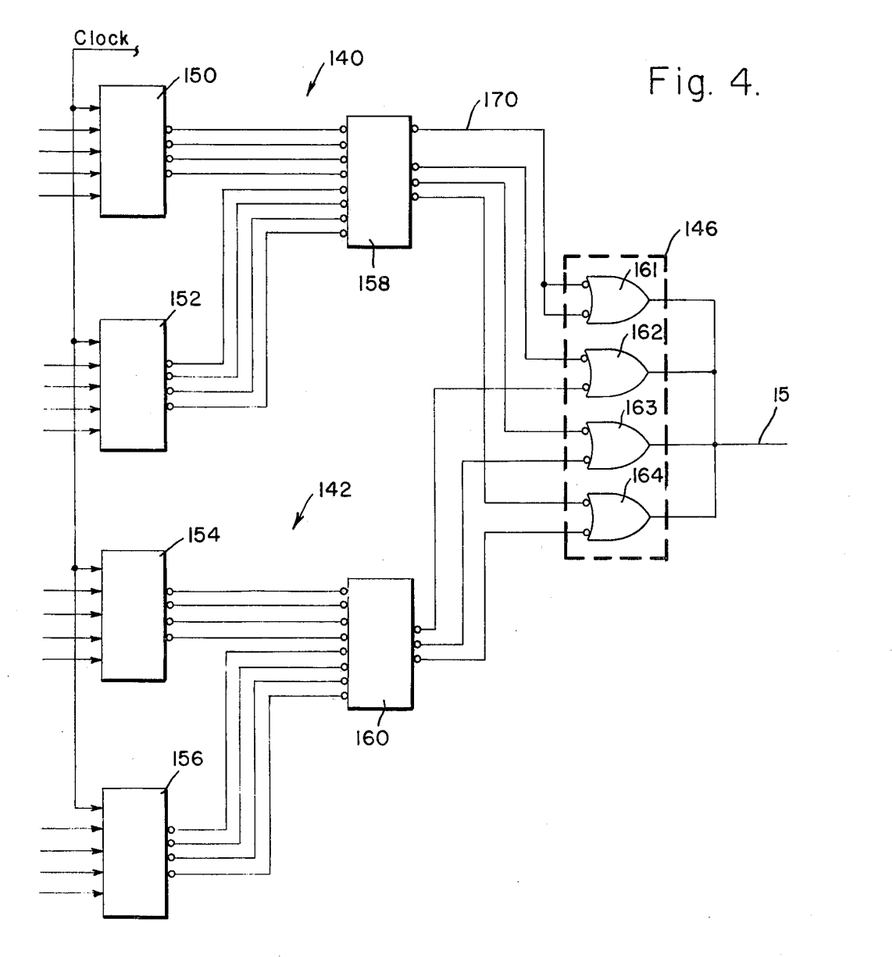
FIG. 4 is a schematic block and circuit diagram showing in further detail the priority encoding system which includes the latches, priority encoders and priority gating unit of FIG. 2.

Referring now also to the priority encoding system of FIG. 4, the unit 140 includes clocked latching units 150 and 152 each receiving four comparison values from comparators of different significance and the unit 142 includes clocked latching units 154 and 156 each also receiving four comparison values of different significance. Each of the latching units are clocked and each stores the input comparison value and provides four output signals therefrom. The latches 150, 152, 154 and 156 may for example, be IC No. 74S175. Priority encoder units 158 and 160 each receive eight comparison values and supply three output signals to NOR gates 162 and 164 of the priority gating unit 146 which for example, may be an IC No. 74S00. The priority encoder units 158 and 160 may be IC No. 74LS148 units. The output of each comparator from the bottom to the top contributes to the output digital number. The following table indicates the signals supplied to the priority encoder units 158 and 160 and out of the priority gating unit 146.

| BINARY LEVEL OF INPUT SIGNAL TO PRIORITY ENCODER UNITS | DIGITAL SIGNAL OUT OF PRIORITY GATING UNIT |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 1100 |
| 13 | 1101 |
| 14 | 1110 |
| 15 | 1111 |

Because of the similarity between the first eight and the last eight comparator outputs, except for the most significant bit, encoder units 158 and 160 each have three output leads except for the encoder 158 which also has a carry lead which has a high binary value theron when a positive comparator signal is received by the encoder 158. Thus, each of the NOR gates 162 to 164 receives signals from corresponding comparator points of the upper and lower half of the ladder network 24 and the NOR gate 161 receives at both of its input terminals a carry signal to provide the most significant bits of the four bit binary output number. It is to be noted that this illustrated priority encoding arrangement is only one arrangement that may be utilized and that the scope of the invention includes any suitable binary encoding configuration.

Figure 5:
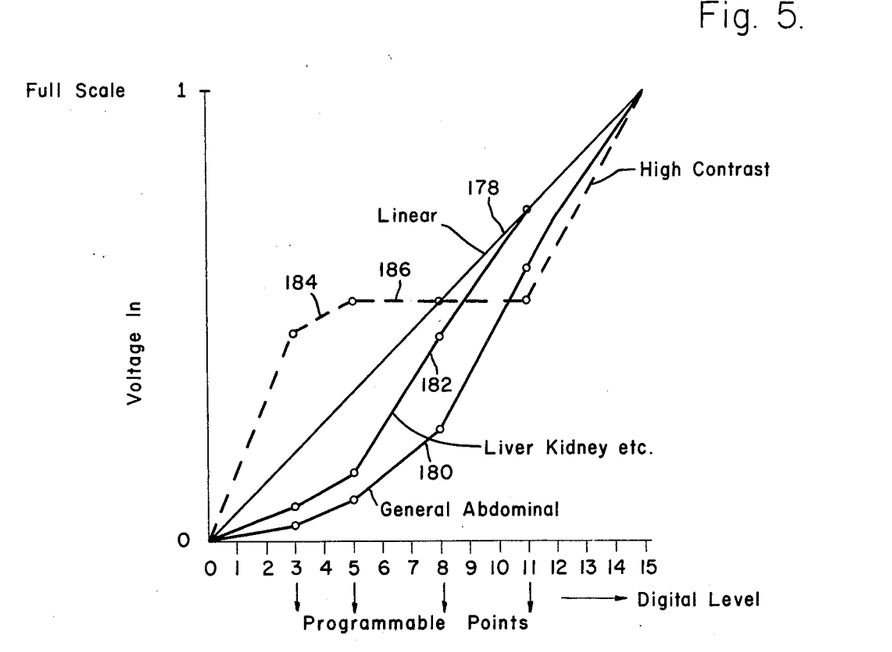
FIG. 5 is a graph of voltage in versus binary level as defined by the converter of FIG. 2.

Referring now to the curves found in FIG. 5 illustrating the analog to digital converter operating in an ultrasonic system, the voltage in ($V_{IN}$) is shown as a function of the digital level of the output signal with a curve 178 indicating a linear transfer function that may be provided without the programming in accordance with the invention. For example, if the medical diagnosis is for general abdominal, a curve 180 may be selected to increase the system sensitivity or responsivity for emphasis in the lower input voltage range. If the medical diagnosis is to be for the liver and kidney for example, a curve 182 may be selected having a range of fairly high sensitivity over a somewhat smaller voltage range than the curve 180. If for example, an obstetrics examination or a biparietal diameter measurement is to be required, a high contrast curve 184 may be programmed and selected with the high contrast of the bone structure provided by a curve portion 186. Although the programming unit 88 of FIG. 2 is illustrated as only providing selection for two transfer functions, it is to be understood that any number of similar curves may be programmed into the programming unit 88 of FIG. 2 and selected when required. The curves of FIG. 5 are shown with only four programmable points, but it is to be recognized that this is only for illustrative purposes and additional programmable points or nodes may be provided in the ladder network 24.

Figure 6:
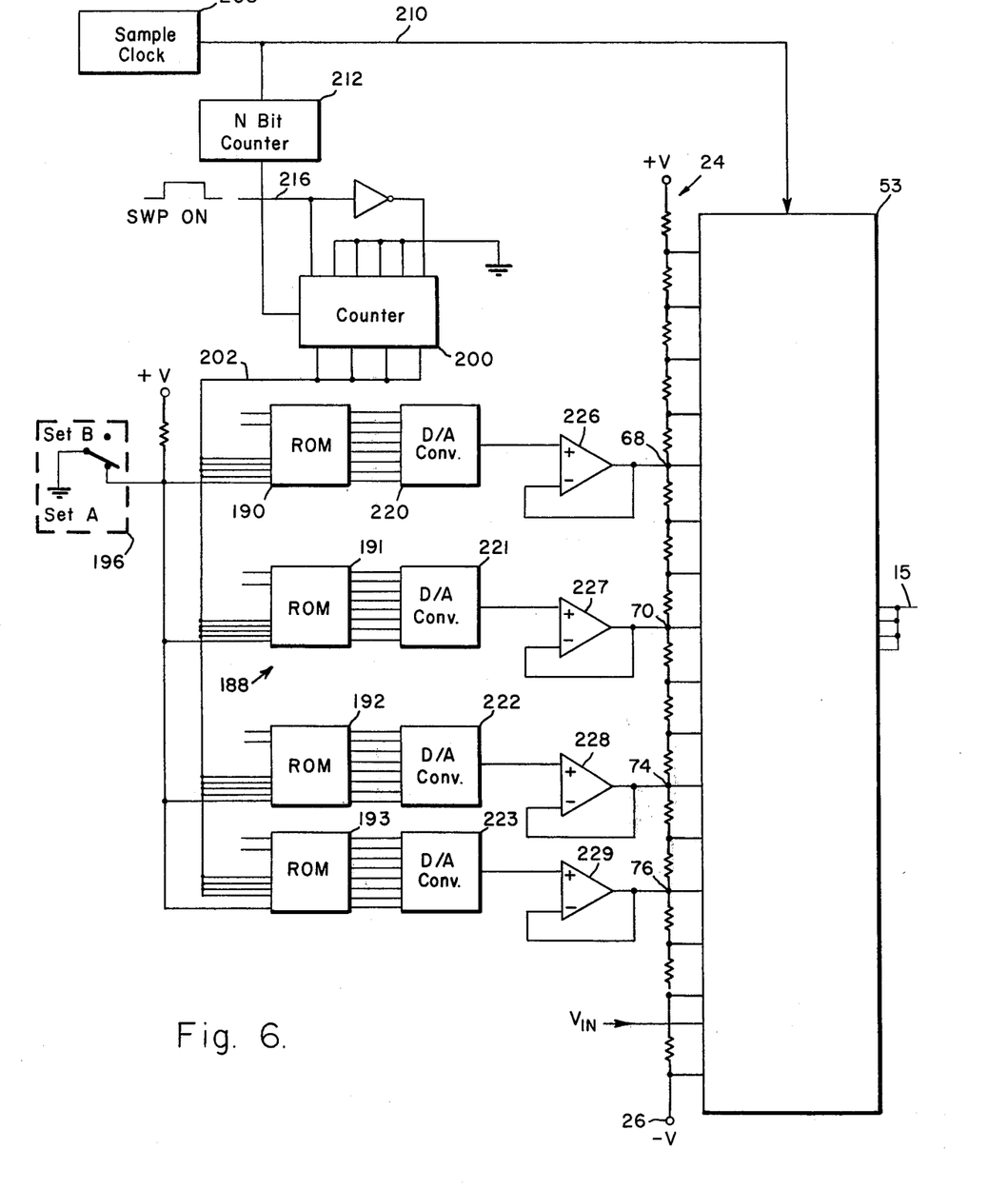
FIG. 6 is a schematic circuit and block diagram showing the programmable analog to digital converter providing a time variable transfer function in accordance with the invention.

Referring now to FIG. 6, a programmed analog to digital converter providing a time variable transfer function in accordance with the invention, will be explained. In the illustrative arrangement, the ladder network 24 and the comparator and priority encoding system 53 are similar to that explained relative to FIG. 2. It is to be understood that the ladder network 24 may be nonlinear in accordance with the invention as explained relative to FIG. 3 to decrease the system drift. A programmed time variable unit 188 is illustrated as having read only memory (ROM) units in which stored digital values are rapidly looked up for providing voltages to the control nodes or points 68, 70, 74 and 76. Read only memory units 190 to 193 are each illustrated as a 32×8 bit memory because this size memory may be purchased as a conventional unit IC No. 74188. Each read only memory is divided into two portions set A and set B, selectable by a selection switch 196 which may be any suitable type of electronic or mechanical switch, for example. A counter 200 which is a time controlled selector means and which may be an IC No. 74LS191 counter, provides four outputs, $Q_0$, $Q_1$, $Q_2$ and $Q_3$ through a composite lead 202 to each of the read only memories 190 to 193. The set A and set B bit in conjunction with the $Q_0$, $Q_1$, $Q_2$ and $Q_3$ bits provides the addresses to the read only memories. A sample clock signal from a sample clock 208 of the timing source 20 (FIG. 1) applies clock signals through a lead 210 and through an N bit counter 212 to the counter 200 so that the programming or transfer function is changed at a relative slow rate compared to the sample clock that is applied to the latching and priority units 140 and 142 of the unit 53. The counter 200 is timed by a SWP ON signal on a lead 216 which is derived from the timing source 20 of FIG. 1. Each of the read only memories 190 to 193 has leads on which eight bit digital words are applied to respective digital to analog (D/A) converters 220 to 223 and in turn through amplifiers 226 to 229 which may be unity gain differential amplifiers, as illustrated. The amplifiers 226 to 229 provide a low impedance output to the respective programming points 68, 70, 74 and 76 to provide a stable transfer function. The control voltages are maintained until the counter 200 again applies a new look-up address to the read only memories and selects a new set of programmed digital control voltages. In the illustrated arrangement, ecah output of the counter 200 selects a new memory cell but similar values are stored in a plurality of sequential memory cells selected during the desired time of occurrence of one function. When the time of the sweep or the number of clocks requires a change of function, the memory cells being addressed at that time have been programmed with new control voltages.

Figure 7:
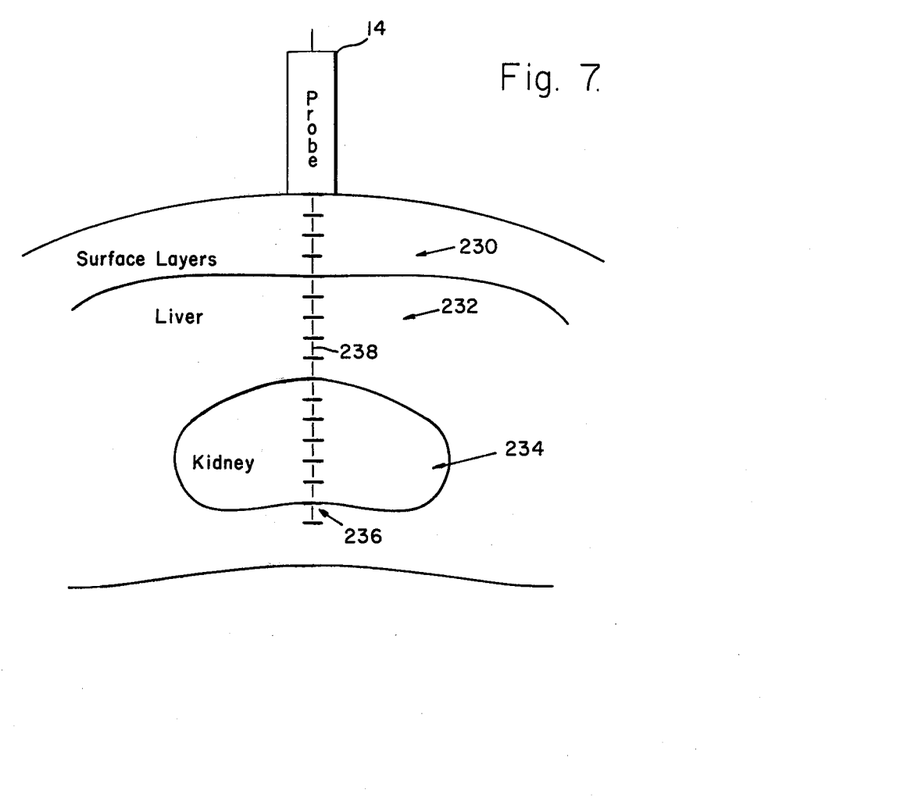
FIG. 7 is a schematic sectional view through a portion of a human body for explaining the time variable transfer function in accordance with the invention.
Figure 8:
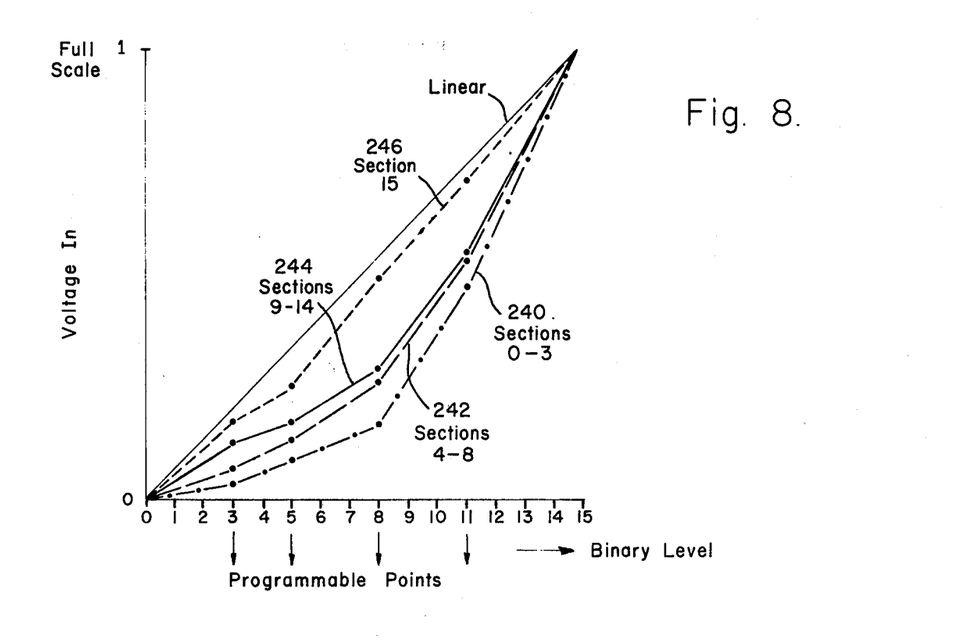
FIG. 8 is a graph showing curves of voltage in as a function of the binary level out of the converter for explaining the operation of the system of FIG. 6.

Referring now to FIGS. 7 and 8, the sensor probe 14 is shown in FIG. 7 transmitting and receiving ultrasonic energy through a portion of a human body. The illustrated section of a body includes surface layers 230, a liver area 232, a kidney area 234 and an a cavity area 236. The path of the transmitted and received energy indicated as a dotted line 238 is divided up into 16 equal distance sections with the surface layers 230 including approximately four sections, the liver area including five sections, the kidney area including six sections and the cavity area including one section. Assuming that the ultrasonic energy has a constant velocity, each section may illustrate the time of each count of the counter 200 or the time between input clock pulses. As an ultrasonic pulse of energy is transmitted from the probe 14 along the path of the line 238, different transfer functions because of the different reflectivity and other characteristics of the different body structures, are desirable for increased clarity of display with the transfer functions being illustrated as curves 240, 242, 244 and 246 in FIG. 8. The transfer function of curves 240, 242, 244 and 246 are for converting the input voltages derived from respective sections zero to three, sections four to eight, sections nine to fourteen and section fifteen. It is to be noted that in the illustrated arrangement, the ultrasonic energy is assumed to have a constant velocity when passing through the different portions which is consistent with the assumption in most ultrasonic diagnostic systems.

The following table shows the sections 0 to 15 of FIG. 7, the read only memory address from the counter 200, $Q_0$ to $Q_3$, and the output voltage from one read only memory that is applied to one D/A converter, shown as eights bits. Each of the four read only memory output voltages from a ROM such as 190 represent points of four different transfer functions and are apportioned among the 16 illustrated read only memory addresses in correspondance to the time at which that transfer function is utilized. It is to be noted that in the system with the illustrated four transfer functions, each of the read only memories has the four inflection point voltages apportioned among the same number of sequentially addressable cells.

priority encoder units 140 and 142 of the unit 53. Thus, it can be seen that in response to the sample clock pulses of the waveform 260, a great number of conversions are performed for each new transfer function that is selected by the counter 200. In the illustrated system the stored curves or transfer functions may be selected for different size people and for different portions of the body to correspond to their body configurations.

As is well known in the art, the transmitted ultrasonic energy is returned to the sensor principally as a function of the angle of incidence, the amount of reflected energy, the amount of absorption and the amount of transmitted energy or energy passed on through the tissue. On the average, the consistent material in one organ will produce echos having different amplitude levels than in another organ so that the system in accordance with the invention can utilize separate curves for each organ or type of body structure.

The analog to digital converter of FIG. 6 utilizing a read only memory is only one illustrated arrangement in accordance with the concept of this invention as other suitable arrangements such as a processor providing the digital programming values may be utilized, assuming that a processor is available with a suitable operating

| SECTION | ROM ADDRESS FROM COUNTER | | | | ROM OUTPUT TO D/A CONVERTER | | | | | | | | |
|---|---|---|---|---|---|---|---|---|---|---|---|---|---|
| | $Q_0$ | $Q_1$ | $Q_2$ | $Q_3$ | 0 | 1 | 2 | 3 | 4 | 5 | 6 | 7 | |
| 0 | 0 | 0 | 0 | 0 | 0 | 0 | 0 | 0 | 1 | 0 | 0 | 0 | ⎫ |
| 1 | 0 | 0 | 0 | 1 | 0 | 0 | 0 | 0 | 1 | 0 | 0 | 0 | ⎬ 4 |
| 2 | 0 | 0 | 1 | 0 | 0 | 0 | 0 | 0 | 1 | 0 | 0 | 0 | |
| 3 | 0 | 0 | 1 | 1 | 0 | 0 | 0 | 0 | 1 | 0 | 0 | 0 | ⎭ |
| 4 | 0 | 1 | 0 | 0 | 0 | 0 | 0 | 1 | 1 | 0 | 1 | 0 | ⎫ |
| 5 | 0 | 1 | 0 | 1 | 0 | 0 | 0 | 1 | 1 | 0 | 1 | 0 | |
| 6 | 0 | 1 | 1 | 0 | 0 | 0 | 0 | 1 | 1 | 0 | 1 | 0 | ⎬ 5 |
| 7 | 0 | 1 | 1 | 1 | 0 | 0 | 0 | 1 | 1 | 0 | 1 | 0 | |
| 8 | 1 | 0 | 0 | 0 | 0 | 0 | 0 | 1 | 1 | 0 | 1 | 0 | ⎭ |
| 9 | 1 | 0 | 0 | 1 | 0 | 0 | 1 | 1 | 1 | 0 | 1 | 1 | ⎫ |
| 10 | 1 | 0 | 1 | 0 | 0 | 0 | 1 | 1 | 1 | 0 | 1 | 1 | |
| 11 | 1 | 0 | 1 | 1 | 0 | 0 | 1 | 1 | 1 | 0 | 1 | 1 | ⎬ 6 |
| 12 | 1 | 1 | 0 | 0 | 0 | 0 | 1 | 1 | 1 | 0 | 1 | 1 | |
| 13 | 1 | 1 | 0 | 1 | 0 | 0 | 1 | 1 | 1 | 0 | 1 | 1 | |
| 14 | 1 | 1 | 1 | 0 | 0 | 0 | 1 | 1 | 1 | 0 | 1 | 1 | ⎭ |
| 15 | 1 | 1 | 1 | 1 | 0 | 1 | 1 | 0 | 1 | 1 | 0 | 0 | } 1 |

The changing of the transfer function by storing different digital words in different groups of cells in a plurality of read only memories is only one arrangement for changing the function, and other arrangements may be utilized within the scope of the invention.

Figure 9:
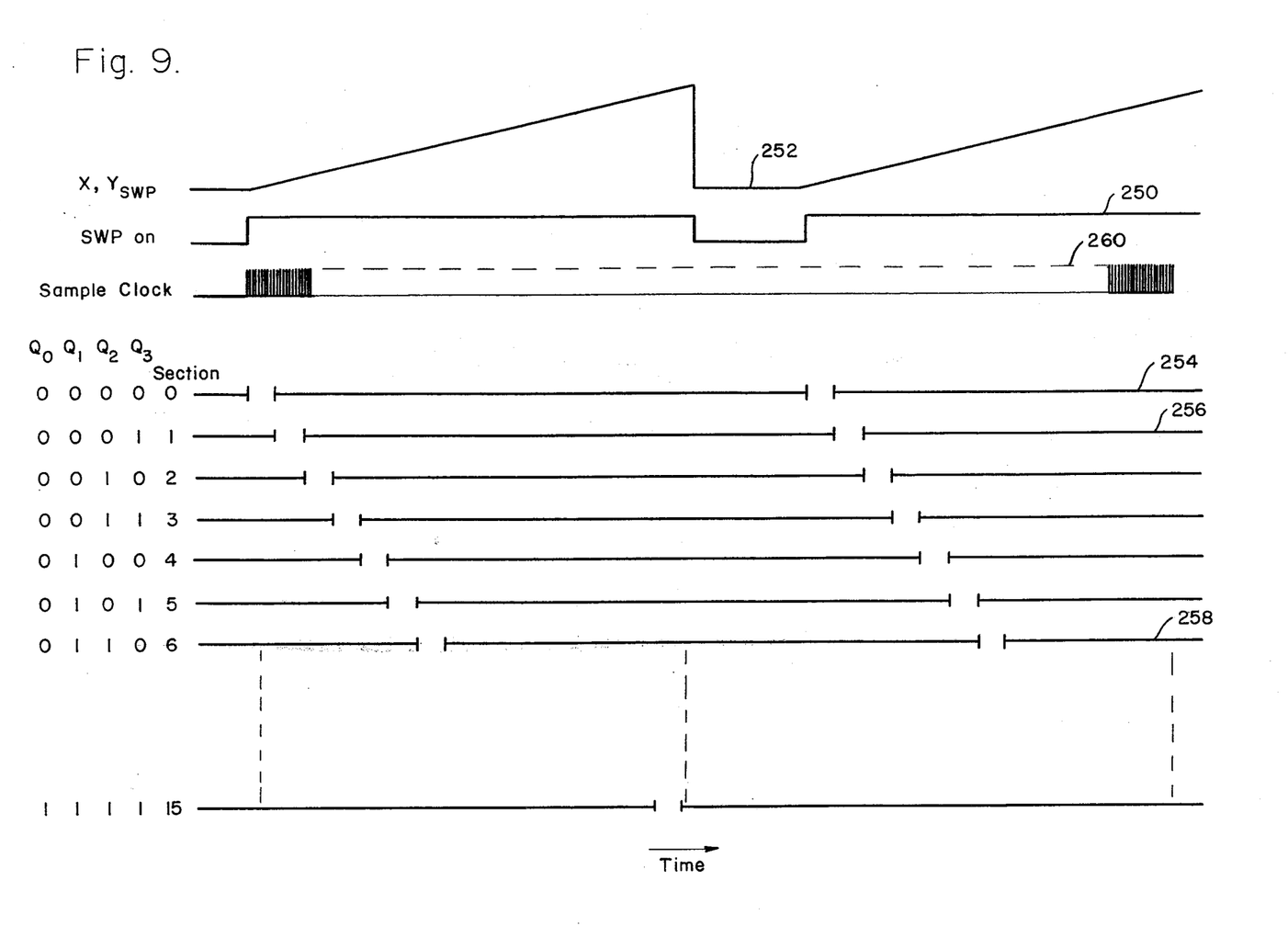
FIG. 9 is a schematic diagram of waveforms of amplitude as a function of time for further explaining the A/D converter of FIG. 6 having a time varying transfer function.

Referring now also to the waveforms of FIG. 9, the SWP ON (sweep on) signal of a waveform 250 may be derived from the X,Y sweep timing source 20 of FIG. 1 and the X,Y SWP signal of a waveform 252 which may be either the $X_{SWP}$ or $Y_{SWP}$ signal may be derived from the transmitter and receiver 12. The SWP ON signal and the X,Y SWP signals are respectively representative of the depth of interrogation of the ultrasonic energy and the direction of sweep as shown in the previously referenced patents. In response to each output $Q_0$ to $Q_3$ from the counter 200, different transfer functions are selected for different groups of sections in depth through the body (FIG. 7) and occur during groups of timing sections of waveforms such as 254, 256 and 258. The waveforms such as 254, 256 and 258 are shown to illustrate the time period during which sample CLK pulses of a waveform 260 are applied to the latching and speed. If a processor were utilized, the selection source may provide an input selection address to the processor memory, for example.

Thus, there has been described a programmable analog to digital converter that allows the converter transfer function of input voltage into an output digital number to be changed as desired to match stored on real time input data from nonlinear input devices such as transducers or process control operations. The converter transfer function is programmable in a variety of ways illustrated as being done with header resistors and stored digital values. The transfer point for each programmable level is individually assignable independent of the other levels. In one arrangement in accordance with the invention a fixed programmed source of voltage is provided and these programs or transfer functions may be selected manually as required for different input signal conditions. In the time varying programmed analog to digital converter, transfer functions may be changed as a function of time by an automatic selection arrangement to clarify the picture provided by the input video signal received from different portions of the body as portions of a transmitted pulse of energy are reflected from the different portions. The programmable transfer function allows a finite number of digital levels to be assigned or apportioned so that levels of interest may be emphasized for providing more gray level detail where required. The concept of the invention not only simplifies the analog to digital converter but allows the minimization of any follow on memory size or bit requirements since the transfer function can be matched to the information content that is desired. Also within the scope of the invention, the ladder network may be selected to be nonlinear so as to be near or in a range of converter transfer functions so as to minimize system drift. It is to be understood that the principles of the invention are not to be limited to the particular arrangement of storing the transfer curves or to the particular arrangement of providing the time varying values but that the scope of the invention includes variations thereof such as sample and hold circuits or processor circuits.

What is claimed is:

1. An analog to digital converter for responding to an input signal to provide binary output signals each representing a different digital level comprising:
   first and second sources of potential,
   a voltage divider network coupled between said first and second sources of potential and having a plurality of control nodes therebetween,
   a plurality of comparator means, each of a different order of binary significance and coupled to said voltage divider network, each of said plurality of comparator means receiving said input signal,
   priority encoding means coupled to said plurality of comparator means, and
   a programmed source of analog voltage coupled to said plurality of control nodes to provide voltages at each of said plurality of control nodes as a plurality of voltage sets with each voltage set representing a group of converter transfer functions, said programmed source including time controlled selection means to provide different ones of said voltage sets to said plurality of control nodes as a function of time.

2. The combination of claim 1 in which said programmed source includes digital storage means for storing said voltage sets as sets of digital voltage values with each set representative of a converter transfer function, and includes digital to analog converter means coupled between said digital storage means and said control nodes for responding to said sets of digital voltage values and applying said sets to said control nodes.

3. The combination of claim 2 in which said digital storage means includes a plurality of read only memories.

4. The combination of claim 2 in which said selection means is comprised of counter means coupled to said digital storage means for addressing sequential cells therein.

5. The combination of claim 4 in which said digital storage means includes a plurality of read only memories and said programmed source further comprises clock means coupled to said counter means and in which selected numbers of sequential cells in each of said read only memories includes the same sets of digital voltages for providing selected converter transfer functions during predetermined time intervals.

6. The combination of claim 1 in which predetermined quantum voltages of said voltage divider network provide a selected nonlinear converter transfer function in the absence of voltage sets at said control nodes.

7. An analog to digital converter for responding to an input signal to provide a digital output signal comprising:
   a voltage divider network for providing at a plurality of reference points, a plurality of reference voltages representative of a predetermined transfer function, said voltage divider network having a predetermined number of control nodes at selected reference points,
   comparator means responsive to said input signal and coupled to said reference points for responding to said reference voltages to provide output signals representative of the binary value of said input signal,
   priority encoding means including latching means coupled to said comparator means for providing said digital output signal, and
   programmable means coupled to said control nodes and including counting means, said programmable means providing different sets of voltages to said voltage divider network as a function of time for varying said predetermined transfer function to selected transfer functions of input signal level versus output signal digital levels, said sets of voltages each being representative of a different selected transfer function.

8. An analog to digital converter for responding to a source of input signals to provide binary output signals each representing a different digital level comprising:
   a voltage divider network including a plurality of series coupled resistors with connecting points therebetween having predetermined quantum voltages between said connecting points and being of an increasing order of significance from one end to the other, a selected plurality of said connecting points being control points,
   a plurality of comparators of different orders of significance with each coupled to a different connecting point of said voltage divider network, each of said comparator means being responsive to said source of input signals to provide an output signal when the voltage of the input signal exceeds the voltage at the corresponding connecting point,
   priority encoding means coupled to said plurality of comparators and responsive to the output signals of said comparators to provide said binary output signals, and
   programmable means including programmed digital memory means and digital to analog converter means coupled between said programmed digital memory means and said plurality of control points for providing voltage sets to said control points to develop selected converter transfer functions having an input signal level versus output signal digital level characteristic defined by the voltage sets at said control points and said quantum voltages, said programmable means including time controlled selection means in turn including counter means for addressing said programmed digital memory means for selecting said voltage sets to be applied to said control points.

9. An analog to digital converter for responding to a source of input signals to provide binary output signals each representing a different digital level comprising:
- a voltage divider network including a plurality of series coupled resistors with connecting points therebetween having predetermined quantum voltages between said connecting points and being of an increasing order of significance from one end to the other, a selected plurality of said connecting points being control points,
- a plurality of comparators of different orders of significance with each coupled to a different connecting point of said voltage divider network, each of said comparator means being responsive to said source of input signals to provide an output signal when the voltage of the input signal exceeds the voltage at the corresponding connecting point,
- priority encoding means coupled to said plurality of comparators and responsive to the output signals of said comparators to provide said binary output signals, and
- programmable means for providing voltage sets to said control points to develop selected converter transfer functions having an input signal level versus output signal digital value characteristic defined by the voltage sets at said control points and said quantum voltages, said programmable means including a resistive network for providing a plurality of current signal sets with each current signal set being representative of a converter transfer function, selection means for selecting said voltage sets to be applied to said control points, multiplexing means coupled to said resistive network and responsive to said selection means, and amplifier means coupled between said multiplexing means and said control points for responding to said current signal sets and applying said voltage sets to said control points.

* * * * *